(12) United States Patent
Mok

(10) Patent No.: US 6,352,104 B1
(45) Date of Patent: Mar. 5, 2002

(54) HEAT SINK WITH ENHANCED HEAT SPREADING AND COMPLIANT INTERFACE FOR BETTER HEAT TRANSFER

(75) Inventor: Lawrence Shungwei Mok, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/420,650

(22) Filed: Oct. 19, 1999

(51) Int. Cl.[7] .................................................. F28F 7/00
(52) U.S. Cl. ............................ 165/80.3; 165/104.33; 165/185; 361/700; 257/715; 257/722; 174/15.2
(58) Field of Search .................... 165/80.3, 104.26, 165/104.33, 185; 361/700, 704; 257/714, 715, 722; 174/15.2

(56) References Cited

U.S. PATENT DOCUMENTS

| 2,965,819 | A | * | 12/1960 | Rosenbaum | ................ 257/722 |
| 4,203,129 | A | * | 5/1980 | Oktay et al. | ........ 165/104.33 X |
| 4,675,783 | A | | 6/1987 | Murase et al. | |
| 4,770,242 | A | * | 9/1988 | Daikoku et al. | ........ 257/722 X |
| 4,800,956 | A | * | 1/1989 | Hamburgen | ............ 257/722 X |
| 5,224,017 | A | * | 6/1993 | Martin | .................... 165/185 X |
| 5,412,535 | A | | 5/1995 | Chao et al. | |
| 6,105,662 | A | * | 8/2000 | Suzuki | ................... 165/104.33 |

FOREIGN PATENT DOCUMENTS

| EP | 0702872 | * | 3/1996 | ............. 165/80.3 X |
| JP | 0083183 | * | 5/1983 | ............. 165/104.33 |
| JP | 404048763 | * | 2/1992 | ................. 257/719 |

* cited by examiner

Primary Examiner—Christopher Atkinson
(74) Attorney, Agent, or Firm—Scully, Scott, Murphy & Presser; Dennis P. Morris, Esq.

(57) ABSTRACT

Heat dissipation systems and structures which are employed in the cooling of electronic devices and/or semiconductor integrated-circuit chips which are installed in computer and/or communications systems. Moreover, disclosed is a method for implementing the heat dissipation systems and structures.

24 Claims, 4 Drawing Sheets

HEAT SINK WITH ENHANCED HEAT SPREADING AND COMPLIANT INTERFACE FOR BETTER HEAT TRANSFER

BACKGROUND OF THE INVENTION

1. Field of the Invention

The present invention relates to heat dissipation systems and structures which are employed in the cooling of electronic devices and/or semiconductor integrated-circuit chips which are installed in computer and/or communications systems. Moreover, the invention discloses a method for implementing the heat dissipation systems and structures.

2. Discussion of the Prior Art

Murage, et al., U.S. Pat. No. 4,675,783 entitled "Heat Pipe Heat Sink for Semiconductor Devices" teaches a method of arranging heat pipes in a zigzag configuration extending towards the direction of an air flow around the fin section of the heat sink. Furthermore, a semiconductor device is mounted on a block at the heat-inlet section of the heat pipes.

Chao et al., U.S. Pat. No. 5,412,535 entitled "Apparatus and Method for Cooling Electronic Devices" discloses a heat transfer assembly which is mounted on a printed-wiring board, and includes mechanical structure adapted to support an electronic device. A heat pipe equipped with fins is mounted so as to extend perpendicularly of the heat transfer assembly.

Neither of these above-referenced patents address themselves to the problems encountered with regard to enhanced heat spreading and compliant interfacing of components in order to achieve an improved degree of heat transference.

SUMMARY OF THE INVENTION

Accordingly, in order to obviate the drawbacks encountered in the prior art, pursuant to the invention there is disclosed a highly efficient heat sink structure which is adapted to improve the cooling capability of electronic and semiconductor devices. The heat sink essentially consists of multiple sets of heat distribution means which are constructed with a plurality of heat pipes adapted to transfer heat directly from the heat generating devices to various locations on the heat sink. The ends of the heat pipes are mounted inside of a heat-transfer block which is located on the surface of the heat generating device through the intermediary of a set of springs. The heat-transfer block is preferably dissected into smaller sections in order to further improve the interfacing compliance and to also reduce any mechanical stresses which may be transferred to the electronic devices.

Accordingly, it is an object of the present invention to provide heat sink means which is adapted to improve the cooling capability of electronic and/or semiconductor devices.

Another object of the invention is to provide a method for constructing a compliant interface between a heat sink and a heat generating device which will result in an efficient heat transfer between these components.

A further object of the invention is the utilization of heat pipes to distribute heat evenly about the heat sink in order to boost the best spreading efficiency thereof.

BRIEF DESCRIPTION OF THE DRAWINGS

The above-listed objects and other advantageous features of the invention become more readily apparent from the following detailed descriptions, taken in conjunction with the accompanying drawings; in which.

DETAILED DESCRIPTION OF PREFERRED EMBODIMENTS

Figure 1A:
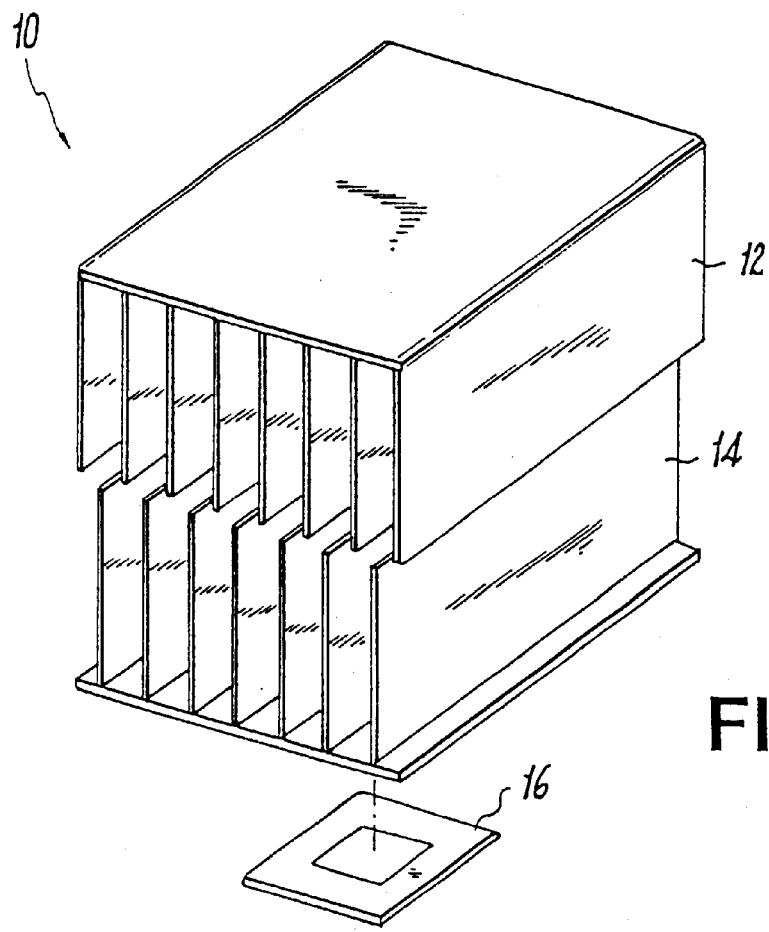
FIGS. 1a and 1b illustrate, respectively, an exploded perspective view and a side view of a heat sink assembly with an electronic device.
Figure 1B:
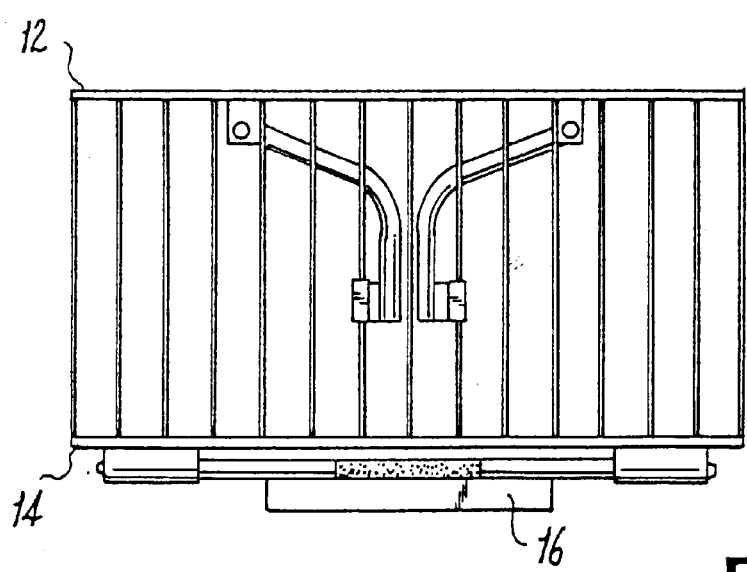

The present invention is directed to the design of an efficient heat sink assembly which is constructed with heat pipes and spring-loaded heat-transfer blocks. An exemplary embodiment of a heat sink assembly is shown in FIGS. 1a and 1b, in which FIG. 1(a) is an exploded perspective view, and FIG. 1(b) is a side view showing the heat sink as mounted on an electronic device. The heat sink assembly 10 consists of upper and lower portions 12 and 14 which are to be interleaved when the heat sink assembly 10 is mounted on top of an electronic device 16.

Figure 2A:
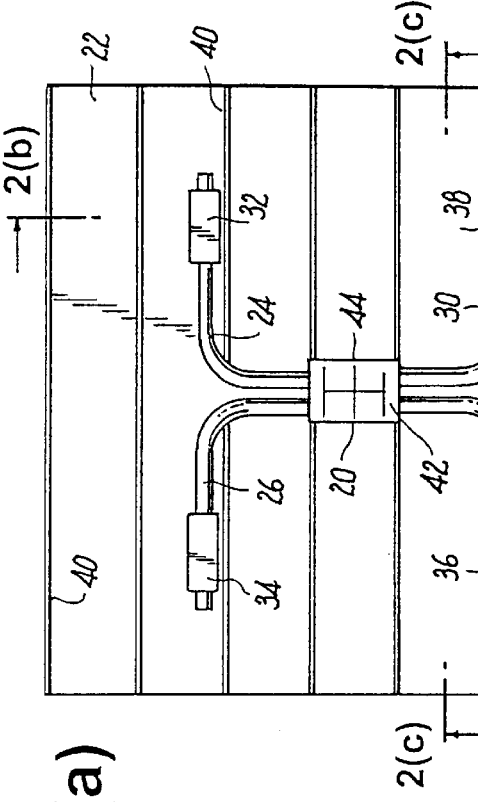
FIGS. 2a to 2c illustrate, respectively, bottom and cross-sectional views of the detailed structure of an upper portion of the heat sink assembly with heat pipes and an inner heat-transfer block.
Figure 2C:
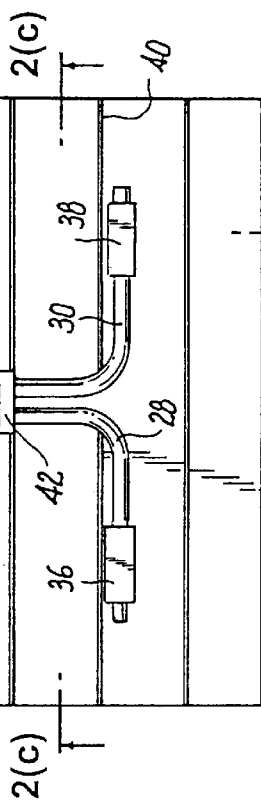
Figure 2C:
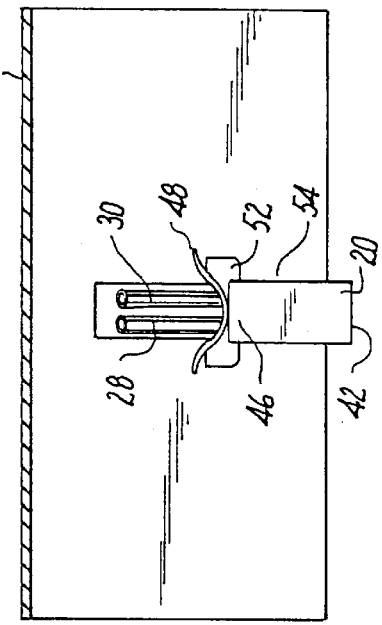
Figure 2B:
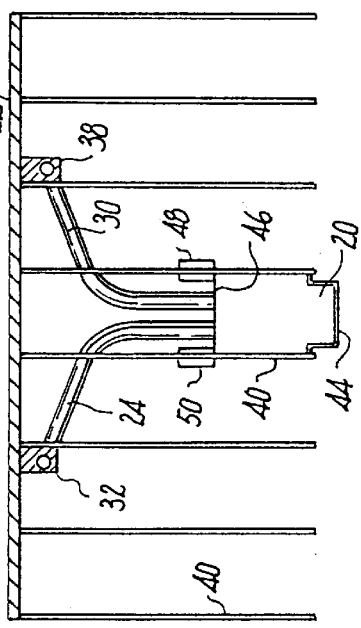

The details of the structure of the upper portion 12 of the heat sink assembly 10 is shown in FIGS. 2(a) through 2(c). Referring to the bottom view of the upper heat sink portion 12 as shown in FIG. 2(a), a heat-transfer block 20 is placed at the center of a heat sink base plate 22. Provided are four heat pipes, 24, 26, 28, and 30, which are connected at one of the ends thereof to the heat-transfer block 20. The other ends of these four heat pipes are positioned at various locations on the heat sink base plate 22 by means of four separate anchors, 32, 34, 36 and 38, respectively. The anchors, 32, 34, 36 and 38, are placed generally close to the fins 40 so as not to block the air which flows between the fins. There are represented eight straight fins in the drawing figure; however, the quantity and type of fins are for illustrative purpose only; since they can be any number and types; such as pin fins, and are not limited to those shown in the drawing figure. The heat-transfer block 20 is dissected into four pieces which are separated by two gaps 42 and 44 and are connected together by a thin sheet of material 46, as shown in FIG. 2(b) which is a cross-sectional view taken along the line A—A in FIG. 2(a). The thin sheet of material 46 can be made from the same material as the heat-transfer block 20, or from other materials possessing low thermal coefficients of expansion, such as a copper-invar-copper, or copper-tungsten alloys. Each heat pipe is inserted into its designated section in the heat transfer block 20. The portion of the heat pipe which is located within the block is in a good thermal contact with the heat transfer block 20. The number of heat pipes and their corresponding sections in the heat transfer block 20 can be varied and should not be limited to four as shown in the drawing figures. The heat transfer block 20 is supported by two plate springs 48 and 50 which are installed in a slot 52 on the fins as shown in the FIG. 2(c) which is a cross-sectional view taken along line B—B in FIG. 2(a). The heat transfer block 20 can be moved slightly up and down along the slot channel 54. When the heat sink assembly 10 is mounted to the electronic device, the heat transfer block 20 will contact the surface of the electronic device and as a consequence, the plate springs 48 and 50 are compressed. The resulting spring force will then act on the heat transfer block 20 to ensure a good heat conduction from the electronic device to the heat transfer block and the heat pipes. This heat-transfer block is accordingly spring-loaded, and thereby provides a compliant interface with the electronic device.

Figure 3C:
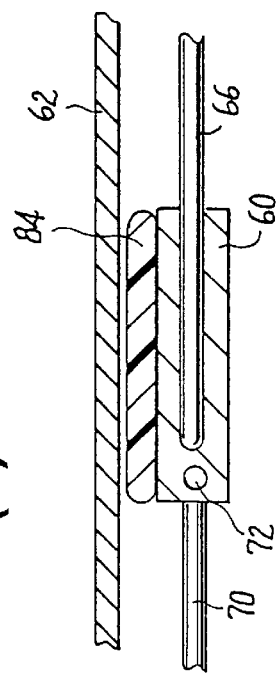
FIGS. 3a, b and c illustrate, respectively, bottom, side and sectional views of the detailed structure of a lower portion of the heat assembly with heat pipes and an outer heat transfer block.
Figure 3A:
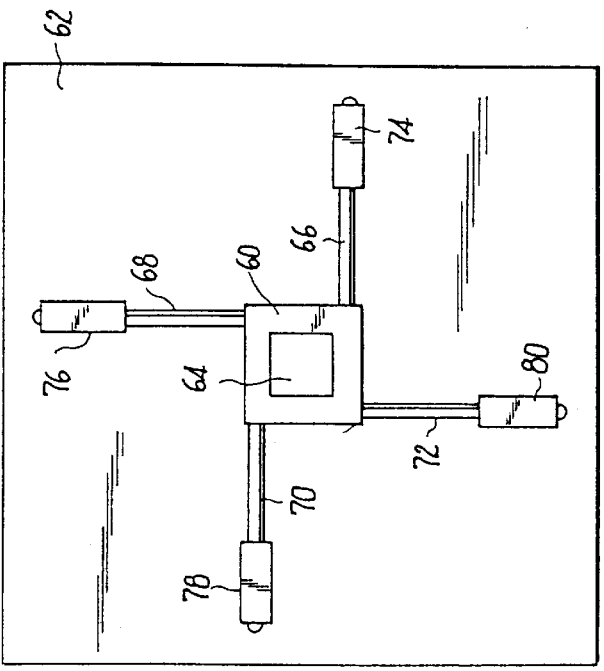
Figure 3B:
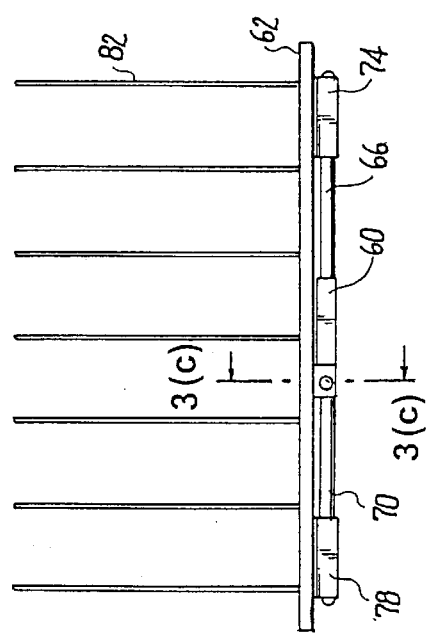

The details of the structure of the lower portion of the heat sink assembly are shown in FIGS. 3(a) to 3(c). The bottom view of the lower heat sink portion 14 is shown in FIG. 3(a), a heat-transfer ring 60 is placed at the center of the heat sink base plate 62. The ring 60 is located such that the heat transfer block 20 from the upper heat sink portion 12 can be inserted through an opening on the heat sink base plate 62 and the center opening 64 of the ring 60 when the upper and lower portions 12, 14 of the heat sink are assembled.

There are four heat pipes, 66, 68, 70 and 72 which are inserted at one of their ends into the heat-transfer ring 60. The other ends of these four heat pipes are located at various locations on the heat sink base plate 62 by means of four separate anchors, 74, 76, 78 and 80, respectively. Provided are seven straight fins 82 on the other side of the heat sink base place 62, as shown in FIG. 3(b). The quantity and type of fins are for illustrative purpose only; since they can be any number and type, such as pin fins, and are not limited to those shown in the drawing figure. The heat-transfer ring 60 is supported by a set of springs 84 which can be made of metal or elastomers, as shown in FIG. 3(c). The springs 84 are compressed when the heat sink is assembled; whereby the reaction force from the springs 84 will, in turn, force the heat transfer ring 60 to make a good thermal contact with the electronic device.

When the upper and lower portions 12 and 14 of the heat sink are interleaved, the heat-transfer block 20 from the upper portion 12 will pass through an opening on the lower heat sink portion base plate 62 and the heat-transfer ring 60. Both of these components will be in good contact with the surface of the electronic device which is to be cooled. The gaps, 42 and 44 on the heat-transfer block 20 can be used to store some thermally conductive materials, such as thermally conductive grease, or phase-changing materials. When the temperature rises, the thermally conductive materials will flow and wet the surfaces of the block and the electronic device, and hence improve the heat transfer from the electronic device to the heat-transfer block. The heat pipes will distribute the heat to various locations on the heat sink base and eliminate the temperature drop along the heat sink base place. The spring-loaded structure at the heat-transfer block and ring makes the heat sink much more compliant to the surface of the electronic device. Furthermore, the heat transfer rates to the block and the ring can be tailored to different levels. For instance, some electronic device may have higher heat flux at the center of the device and require higher cooling rate. In this case, the heat transfer rate at the heat-transfer block can be raised by using more and/or larger heat pipes. The heat pipes described herein can be of any types and any shapes, such as round, flat, oval or polygonal.

The heat sink assembly as disclosed hereinabove can be used as an entirety with the upper and lower portions 12, 14 being interleaved as shown in FIGS. 1(a) and 1(b), or the upper or lower portions can be employed individually. If the lower portion 12 is used alone, the shape of the heat transfer ring 60 can be changed to a plate. Furthermore, the tip of the heat transfer block 20 and surface of the heat transfer ring 60 can be either flat or crown-shaped.

Figure 4A:
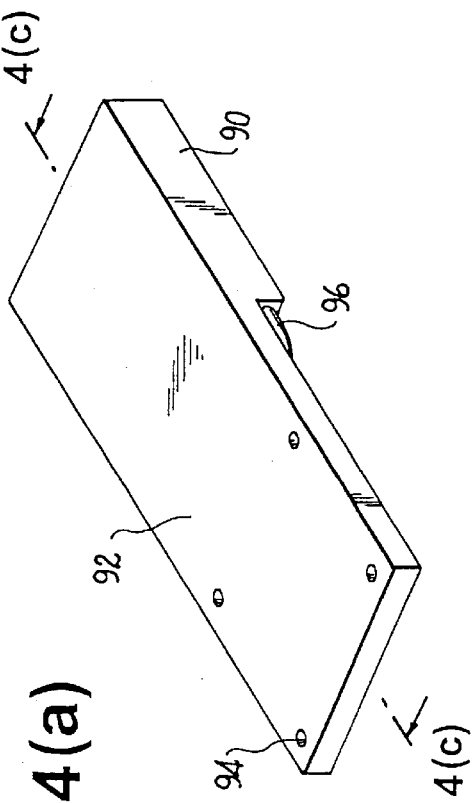
FIGS. 4a to 4c illustrate, respectively, perspective, bottom and sectional views of another embodiment of the heat sink assembly with a therein enclosed cooling fan.
Figure 4B:
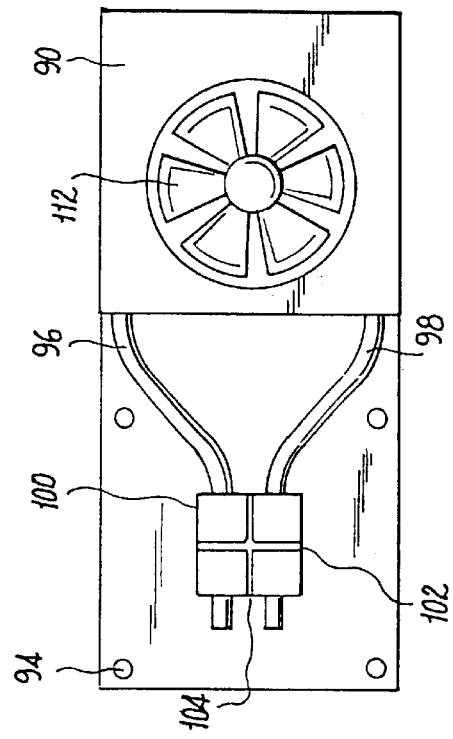
Figure 4C:
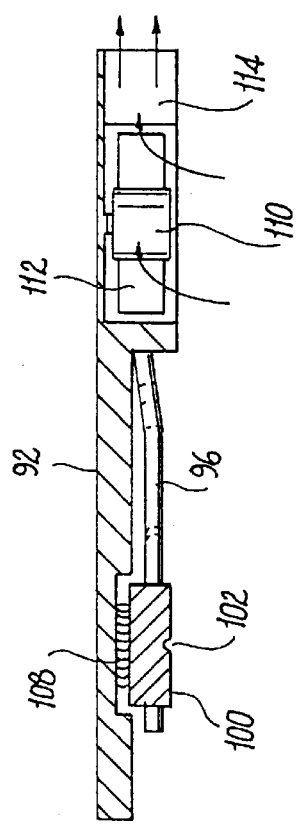

FIGS. 4(a) to 4(c) show another embodiment of present invention, with a cooling fan 90 being embedded or contained within the heat sink structure. The compactness of the disclosed structure renders this embodiment highly suitable for applications such as laptop computers where available space is at a premium. Referring to FIG. 4(a), the heat sink body 92 has the cooling fan 90 embedded or recessed therein, and includes several mounting holes 94 on the other side for this purpose. The bottom view of the heat sink assembly is shown in FIG. 4(b) in which two heat pipes, 96 and 98 have their own ends inserted into the heat sink body 92 near the fan location. The other ends of the heat pipes are inserted into a heat-transfer block 100 which is dissected partially into four pieces, with the inclusion of two gaps 102 and 104. The cross-sectional view of the heat sink body 92 is shown in FIG. 4(c), in which a metal spring or thermally conductive elastomer 108 can be ascertained between the heat-transfer block 100 and the heat sink body 92. A spring 108 is used to bias the heat-transfer block 100 into good contact with an electronic device. Heat is transferred from the electronic device to the block 100 and then to the heat pipes 96 and 98. The heat is then discharged near the fan 90. The fan 90 has a motor 110 mounted directly on the heat sink body 92, and is adapted to drive the fan blades 112. When the blades 112 rotate, air will be propelled upwardly towards the heat sink body 92 and pushed to the exit 114 on the end of the heat sink body 92. The heat delivered from the heat pipes will be picked up by the moving air. The gaps 102 and 104 can be used to store a thermally conductive fluid, such as a thermally conductive grease, or phase-changing materials in order to enhance the heat transfer between the electronic device and the heat-transfer block 100.

While there has been shown and described what are considered to be preferred embodiments of the invention, it will, of course, be understood that various modifications and changes in form or detail could readily be made without departing from the spirit of the invention. It is, therefore, intended that the invention be not limited to the exact form and detail herein shown and described, nor to anything less than the whole of the invention herein disclosed as hereinafter claimed.

What is claimed is:

1. A system facilitating enhanced heat spreading and compliant interfacing between components for improved heat transfer; comprising a heat sink equipped with a plurality of interleaved fins; a plurality of heat pipes connected to said plurality of interleaved fins providing for heat distribution; said plurality of interleaved fins having gaps intermediate said fins to facilitate the transfer of heat from each of said fins to a flow of air passing therebetween; and spring-biased support means for compliant resiliently supported interface of said system with a heated surface.

2. The system according to claim 1, wherein first ends of the heat pipes are joined together in a heat-transfer block which is dissected into a plurality of sections.

3. The system according to claim 2, wherein gaps formed in the heat-transfer block are filled with heat conducting materials selected from a thermally conductive grease or phase changing materials.

4. The system according to claim 2, wherein opposite ends of the heat pipes are mounted at various locations along a heat sink base plate.

5. The system according to claim 2, wherein one said heat-transfer block is in the shape of a ring, and a second said heat transfer block is insertable into a center opening in the ring-shaped heat transfer block.

6. The system according to claim 1, wherein said fins are selectively straight or pin fins.

7. The system according to claim 2, wherein plate springs are positioned between the heat-transfer block and said heat sink, and moveable guards guide the movement of the heat-transfer block.

8. The system according to claim 7, wherein said plate springs are constituted of metal or heat conducting elastomers.

9. The system according to claim 5, wherein said heat-transfer blocks are constituted of heat conducting materials selected from the group consisting of copper and aluminum.

10. The system according to claim 5, wherein said heat-transfer blocks are dissected into pieces from one material block or assembled from individual pieces and mounted on a thin sheet of material.

11. The system according to claim 10, wherein the thin sheet of material is constituted of materials possessing low thermal coefficients of expansion, selected from the group consisting of copper-invar-copper or copper-tungsten alloys.

12. The system according to claim 5, wherein the shape of the heat pipes is selectively round, flat, polygonal or oval; and the heat pipes are flexible to enable a limited displacement of the heat-transfer blocks caused by the springs.

13. A method of facilitating enhanced heat spreading and compliant interfacing between components for improved heat transfer; comprising providing a heat sink equipped with a plurality of interleaved fins; providing a plurality of heat pipes connected to said plurality of interleaved fins for heat distribution; said plurality of interleaved fins having gaps intermediate said fins to facilitate the transfer of heat from each of said fins to a flow of air passing therebetween; and spring-biased support for compliant resiliently supported interfacing with a heated surface.

14. A method according to claim 13, wherein first ends of the heat pipes are joined together in a heat-transfer block which is dissected into a plurality of sections.

15. A method according to claim 14, wherein gaps formed in the heat-transfer block are filled with heat conducting materials selected from a thermally conductive grease or phase-changing materials.

16. A method according to claim 14, wherein opposite ends of the heat pipes are mounted at various locations along a heat sink base plate.

17. A method according to claim 14, wherein one said heat-transfer block is in the shape of a ring, and a second said heat transfer block is insertable into a center opening in the ring-shaped heat transfer block.

18. A method according to claim 13, wherein said fins are selectively straight or pin fins.

19. A method according to claim 14, wherein plate springs are positioned between the heat-transfer block and said heat sink, and moveable guards guide the movement of the heat-transfer block.

20. A method according to claim 19, wherein said plate springs are constituted of metal or heat conducting elastomers.

21. A method according to claim 17, wherein said heat-transfer blocks are constituted of heat conducting materials selected from the group consisting of copper and aluminum.

22. A method according to claim 17, wherein said heat-transfer blocks are dissected into pieces from one material block or assembled from individual pieces and mounted on a thin sheet of material.

23. A method according to claim 22, wherein the thin sheet of material is constituted of materials possessing low thermal coefficients of expansion, selected from the group consisting of copper-invar-copper or copper-tungsten alloys.

24. A method according to claim 17, wherein the shape of the heat pipes is selectively round, flat, polygonal or oval; and the heat pipes are flexible to enable a limited displacement of the heat-transfer blocks caused by the springs.

* * * * *

UNITED STATES PATENT AND TRADEMARK OFFICE
CERTIFICATE OF CORRECTION

PATENT NO.     : 6,352,104 B1
DATED          : March 5, 2002
INVENTOR(S)    : Lawrence S. Mok It is certified that error appears in the above-identified patent and that said Letters Patent is hereby corrected as shown below:

<u>Title page,</u>
Item [74], "Dennis P. Morris, Esq." should read -- Daniel P. Morris, Esq. --

<u>Column 2,</u>
Line 23, "FIGS." should not begin a new paragraph

Signed and Sealed this

Third Day of September, 2002

*Attest:*

*Attesting Officer*

JAMES E. ROGAN
*Director of the United States Patent and Trademark Office*